United States Patent
Su et al.

(10) Patent No.: US 7,314,813 B2
(45) Date of Patent: Jan. 1, 2008

(54) METHODS OF FORMING PLANARIZED MULTILEVEL METALLIZATION IN AN INTEGRATED CIRCUIT

(75) Inventors: Chin-Ta Su, Hsinchu (TW); Jerry Lai, Hsinchu (TW); Yu-Lin Yen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/976,539

(22) Filed: Oct. 29, 2004

(65) Prior Publication Data

US 2006/0094232 A1     May 4, 2006

(51) Int. Cl.
*H01L 21/20*     (2006.01)
(52) U.S. Cl. .............. 438/584; 438/622; 257/E21.17; 257/E21.229; 257/E21.029

(58) Field of Classification Search ............... 438/584, 438/622, 636, 637, 647, 679, 582, 683, 680, 438/681, 687, 688, 697, 692, 712
See application file for complete search history.

(56) References Cited

U.S. PATENT DOCUMENTS

| | | | |
|---|---|---|---|
| 6,057,603 A * | 5/2000 | Dawson ...................... | 257/758 |
| 6,124,640 A * | 9/2000 | Sahota et al. ............... | 257/758 |
| 6,339,027 B1 * | 1/2002 | Chok .......................... | 438/692 |
| 6,992,393 B2 * | 1/2006 | Huang et al. ............... | 257/760 |

* cited by examiner

*Primary Examiner*—David Nhu
(74) *Attorney, Agent, or Firm*—Stout, Uxa, Buyan & Mullins, LLP

(57) ABSTRACT

A method is provided for forming a semiconductor device that reduces metal-stress-induced photo misalignment by incorporating a multi-layered anti-reflective coating over a metal layer. The method includes providing a substrate with a conductive layer formed over the substrate, depositing a multi-layered anti-reflective coating (including alternating layers of titanium and titanium nitride), defining a plurality of conductive lines in connection with a first etching step, depositing a dielectric layer, and defining at least one via in connection with a second etching step.

18 Claims, 8 Drawing Sheets

(-5, 0)
12 nm ( 0, 0)

( 4, 0)
38 nm (-5, 0)
0 nm ( 0, 0)

( 4, 0)
0 nm

METHODS OF FORMING PLANARIZED MULTILEVEL METALLIZATION IN AN INTEGRATED CIRCUIT

BACKGROUND OF THE INVENTION

1. Field of the Invention

The present invention relates generally to methods for forming semiconductor devices and, more particularly, to methods for forming planarized multilevel metallization in an integrated circuit.

2. Description of Related Art

Over the past several years, rapid progress has been made in the semiconductor industry. For example, more electronic components can now be integrated on a single chip to increase performance, reduce cost, and improve process reliability. As a consequence, the interconnect structures by which the electronic components are connected are more complicated.

Interconnect technology, i.e., creating connections between conducting regions, relies heavily upon planarization techniques. Typically, the conductive regions are made of aluminum (Al), which is an attractive material for integrated circuit metallization due to its high conductivity and low cost. The processing required to form aluminum metallization is also relatively easy, as it can be readily evaporated or sputtered onto a wafer. However, certain drawbacks do exist for aluminum metallization such as its relatively poor step coverage, misalignments, and stress-induced issues such as voids. For example, mechanical stress in aluminum material can cause voids therein. Step-coverage faults and stress-induced voids can cause a misalignment and/or opening in a metal line or contact.

As circuit density and device performance requirements increase, more complex wiring or routing of interconnects between conducting regions is required. Vertical and horizontal interconnects are needed as the number of metallization layers increases to meet the requirements of more complex circuits. Present-generation devices may require up to, for example, 5 or 6 layers of metallization to meet the wiring needs of state-of-the-art integrated circuits such as logic devices and static random access memories (SRAMs). Vertical interconnect structures are typically formed using mask-etching processes wherein via are generated over and on metallic lines.

FIG. 1 illustrates a result of an early stage of such a prior-art fabrication process. The illustrated example comprises a substrate 35, an inter-layer dielectric (ILD) layer 36 that overlies the substrate 35, and a metal layer 38 formed of aluminum (Al) on the ILD layer 36. A relatively thin layer 39a of titanium (Ti) is formed on the metal layer 38, and a likewise relatively thin layer 39b of titanium nitride (TiN) is formed on the Ti layer. The Ti and TiN layers form an anti-reflective coating (ARC) 39 of Ti/TiN. A silicon oxynitride (SiON) layer is formed on the ARC 39 to form stack layers, and the stack layers can be etched back to form lines. Subsequently, a high density plasma (HDP) layer can be deposited, followed by the application and patterning of a photoresist to facilitate formation of via by etching the HDP deposited layer and the SiON layer. The photoresist can then be removed, and the via can be filled with a via filler such as tungsten to thereby form a contact.

Circuit structures of the type just described are formed through a photolithography process using a first reticle mask. Photo misalignment errors can occur, for example, when a second reticle mask has not been properly aligned with a first circuit structure. More to the point, photo misalignment can occur when there is a stress-induced shift in a metal film deposition after a photolithography exposure. The stress-induced shift may create an asymmetric metal profile because of the relatively high stress of, for example, a Ti/TiN layer such as ARC 39 above aluminum metal layer 38 in FIG. 1. Metal stress can cause a shift of an alignment mark, resulting in misalignment between a metal layer and a contact element. The term "metal stress" refers to flexing of a metal layer as heat is applied, due, for example, to differences in thermal rates of expansion associated with different metals and different materials. The intrinsic metal stress of, for example, TiN may further exacerbate step coverage asymmetry problems. Such asymmetry problems may occur, for example, when one side of a contact feature sees more deposition flux than another side. Asymmetry can be more prevalent on the outer edges of a wafer when compared to asymmetry near its center.

A need exists in the prior art to reduce metal stress, reduce photo misalignment, improve metal step coverage, and improve process reliability of semiconductor devices. A further need exists to develop optimal methods for forming planarized multilevel metallization in semiconductor devices, for example, integrated circuits.

SUMMARY OF THE INVENTION

The present invention addresses these needs by providing simple and feasible methods for forming a semiconductor device having at least one of reduced metal stress, reduced photo misalignment, improved metal step coverage, and improved process reliability compared to conventional semiconductor devices. Improving metal stress conditions can in some instances improve step coverage asymmetry problems and further can reduce photo misalignment errors, which in turn can improve process reliability.

In one embodiment, and by way of example only, a method for forming a semiconductor device can reduce photo misalignment by forming a multi-layered, anti-reflective coating on a metal layer. This multi-layered anti-reflective coating, which in one embodiment is formed over an aluminum (Al) layer, comprises an alternating layers of TiN and titanium (Ti) films. The multi-layered anti-reflective coating can comprise, from top to bottom, two dual layers of TiN and Ti. In a preferred embodiment, the multilayered stack comprises, from top to bottom, TiN/Ti/TiN/Ti films.

A method in accordance with one aspect of the present invention can comprise providing a substrate, an inter-layer dielectric (ILD) layer that overlies the substrate, forming a first conductive layer over the ILD layer, and depositing a multi-layered anti-reflective coating over the first conductive layer. The multi-layered anti-reflective coating may comprise TiN/Ti/TiN/Ti films. According to another aspect of the present invention, the conductive layer and multi-layered anti-reflective coating can be patterned to form a plurality of conductive lines. A material layer, which may comprise a dielectric layer, is then formed over the multi-layered anti-reflective coating, and at least one via is formed. The material layer may act as an inter-metal dielectric (IMD) and can be formed by high density plasma chemical vapor deposition (HDP-CVD). A high density plasma (HDP) layer is then deposited, followed by an application and patterning of a photoresist over the HDP deposited layer. The photoresist facilitates etching of the HDP deposited layer and the multi-layered anti-reflective coating to form via. The photoresist is then removed, and the via can be filled with a conductive material, such as tungsten.

Any feature or combination of features described herein is included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention have been described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
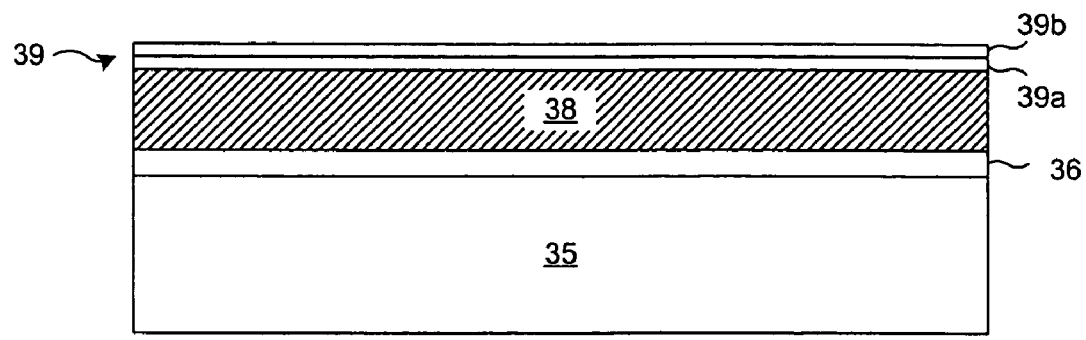
FIG. 1 is a cross-sectional view of prior-art metal and anti-reflective coating layers above a silicon substrate.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated preferred embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the present invention as defined by the appended claims. It is to be understood and appreciated that the processes and structures described herein do not cover a complete process flow for forming planarized multilevel metallization in an integrated circuit. The present invention may be practiced in conjunction with various photolithography techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to methods for forming planarized multilevel metallization in an integrated circuit.

Figure 2:
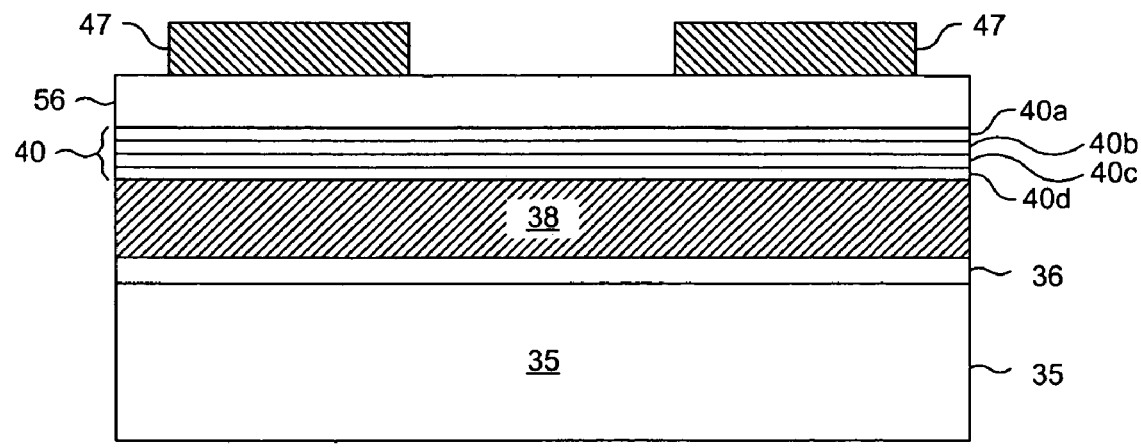
FIG. 2 is a cross-sectional view of a multi-layer film stack including a patterned photoresist layer disposed over a material layer in accordance with a presently preferred embodiment of the invention.

FIG. 2 illustrates a cross-sectional view of a semiconductor structure formed according to the present invention and comprising, from bottom to top, a substrate 35, an inter-layer dielectric (ILD) layer 36, a metal layer 38, and a multi-layered anti-reflective coating 40. The multi-layered anti-reflective coating 40 in the illustrated embodiment comprises four layers formed of (top to bottom) a TiN layer 40a, a Ti layer 40b, a TiN layer 40c, and a Ti layer 40d. The multi-layered anti-reflective coating 40, as presently embodied, thus comprises a TiN/Ti/TiN/Ti film stack. The illustrated embodiment further includes a material layer 56 comprising a dielectric layer, which acts as a dielectric anti-reflection coating (DARC), on the multi-layered anti-reflective coating 40. The material layer 56 may be formed by Plasma Enhanced Chemical Vapor Deposition (PE-CVD) of silicon oxynitride (SiON). Although the substrate 35 preferably comprises a silicon substrate, in alternative embodiments the substrate 35 can comprise materials such as gallium nitride (GaN), gallium arsenide (GaAs), or other materials commonly recognized as suitable semiconductor materials to those skilled in the art. An additional layer formed of Ti, TiN, or Ti/TiN may underlie the metal layer 38 in some embodiments. This additional layer may increase adhesion to the ILD (e.g., oxide) layer and may further increase electron migration in ultra large scale integration (ULSI) applications.

Initially, the substrate 35 is prepared prior to the inter-layer dielectric layer 36 being deposited onto the substrate. The metal layer 38 can comprise, for example, any highly conductive metal such as gold, aluminum, copper, or an alloy of a combination of aluminum and/or copper and other trace elements. As presently embodied, the metal layer 38 comprises aluminum. Although the metal layer 38 is shown formed overlying the ILD layer 36, it is possible for numerous structures such as, for example, field oxide regions, polysilicon regions, metal regions, and active device regions to underlie the metal layer 38.

Figure 7:
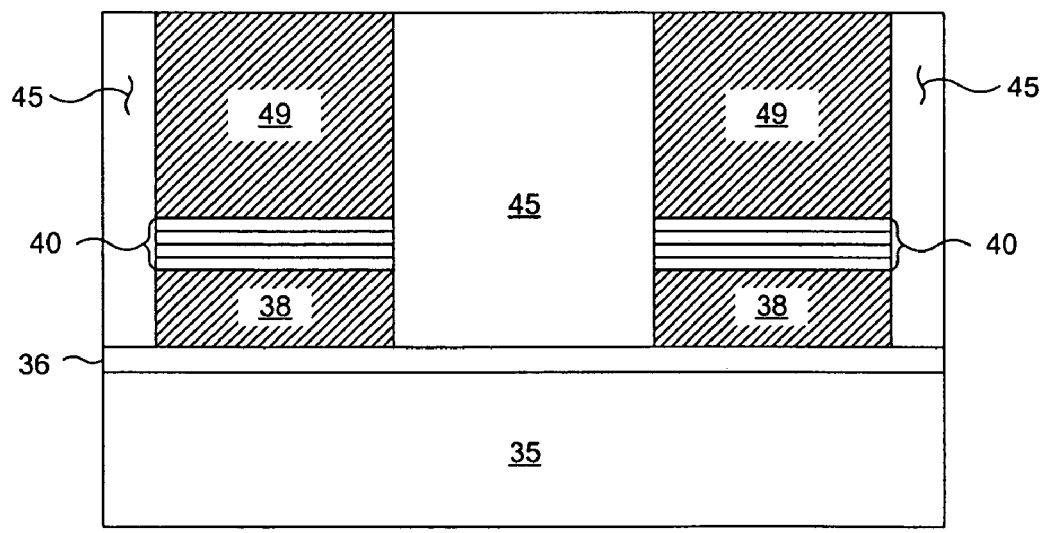
FIG. 7 is a cross-sectional view of the configuration illustrated in FIG. 6 in which a selective etching process has been accomplished to form via, which in turn have been plugged with a via filler in accordance with the present invention.

In the illustrated embodiment, the multi-layered anti-reflective coating 40 is deposited using physical vapor deposition (PVD) techniques. Being relatively hard, dense and refractory, this material can provide high electrical conductivity. The multi-layered anti-reflective coating 40 inhibits undesirable reflectance from metal layer 38 and improves alignment resolution of a photoresist mask to existing structures or alignment marks. The multi-layered anti-reflective coating 40 can further minimize the occurrence of standing waves when using a stepper. This minimization can attenuate exposure problems and can also serve as a lower etch stop, reducing risks of etching into the metal layer 38. Furthermore, as presently embodied, the multi-layered anti-reflective coating 40 can help to prevent reaction between the metal layer 38 and via filler 49 (FIG. 7).

The multi-layered anti-reflective coating 40 may comprise a combination of tantalum nitride (TaN), tungsten nitride (WN), molybdenum nitride (MoN), Ti, or TiN deposited, for example, by PVD. In accordance with an aspect of the present invention, the multi-layered anti-reflective coating 40 comprises dual layers, wherein each dual layer includes at least one layer of Ti alternating with at least one layer of TiN. TiN has been found to have a relatively large stress response to heat or film stress compared to, for example, Al and Ti as indicated by the data in Table 1.

TABLE 1

| Metal film | Film Stress | Stress Type |
|---|---|---|
| Ti | $<5 \times 10^9$ dyne/cm$^2$ | Tensile |
| TiN | $<1 \times 10^{10}$ dyne/cm$^2$ | Tensile |
| Al | $~9 \times 10^8$ dyne/cm$^2$ | Compressive |

Photo-misalignment on metal-profile asymmetry patterning is largely induced by metal stress. Hence, and as an improvement to using only one dual layer of Ti/TiN, the present invention applies the multi-layered anti-reflective coating 40 over the metal. The multi-layered anti-reflective coating 40, having intermittent layers of Ti, can reduce overlay shift, which may otherwise be introduced by only one dual Ti/TiN layer. Application of the multi-layered anti-reflective coating 40 reduces stress and/or may improve step-coverage asymmetry issues at metal deposition stages. Thus, the multi-layered anti-reflective coating 40 can reduce photo misalignments between metal lines and contacts and/or via occurring in the metal photo alignment stages. This process can increase reliability.

According to one embodiment, the multi-layered anti-reflective coating 40 comprises layers of TiN alternating with layers of Ti. As presently embodied, the multi-layered anti-reflective coating 40 comprise a plurality of dual-layers of, from top to bottom, TiN and Ti. In a preferred embodiment, the plurality of dual-layers comprises two dual layers so that the multilayered stack comprises, from top to bottom, TiN/Ti/TiN/Ti films. The four layers of TiN, Ti, TiN and Ti of the multi-layered anti-reflective coating 40 are identified in FIG. 2 by respective reference numbers 40a, 40b, 40c, and 40d. As can be seen from the figure, the layers of TiN and Ti alternate, and the multiple layers of TiN contact the multiple layers of Ti. It is to be understood that multi-layered anti-reflective coating 40 illustrated in FIGS. 3-7 also comprises four layers according to reference numbers 40a, 40b, 40c, and 40d. However, the individual reference numbers 40a, 40b, 40c, and 40d are not shown in FIGS. 3-7 in order to simplify the diagrams.

According to the illustrated embodiment, Ti layer 40d may be deposited to a thickness of about 150 Å using, for example, a PVD process. Likewise using a PVD process, TiN layer 40c may be deposited to a thickness of about 200 Å. Similarly, Ti and TiN layers 40b and 40a may be deposited to respective thicknesses of about 150 Å and 200 Å. The Ti layers 40d and 40b in the anti-reflective coating structure 40 can release TiN stress and may substantially reduce any overlay shift between the metal layer 38 and features aligned with the metal layer 38 that may be added at a later step in the fabrication process.

In accordance with the present invention, the material layer 56 is then applied over the multi-layered anti-reflective coating 40. As presently embodied, the material layer 56 comprises SiON. A layer of patterned photoresist 47 then may be formed on the material layer 56. As is common in the art, the layer of photoresist 47 is first spun onto the wafer. The wafer is then placed into a stepper (photolithography tool for patterning wafers) where it is aligned to a mask and exposed to ultra violet (UV) radiation. If the mask is only large enough to cover a small portion of the wafer, the stepper steps the wafer through many sections, each of them being exposed in turn, until the entire or desired portion(s) has (have) been exposed to UV light. The wafer is then placed into a chemical bath that dissolves the UV-exposed photoresist 47, thereby yielding the patterned photoresist layer 47.

Next, the wafer is positioned within a dry etcher, where it is etched anisotropically. The etchant is preferably unreactive to the photoresist 47 while it etches the material layer 56, the multi-layered anti-reflective coating 40, and the metal layer 38 at varying rates. As presently embodied, the wafer is etched for a time sufficient to completely remove any residual metal 38 from the substrate 35 in the exposed areas.

Figure 3:
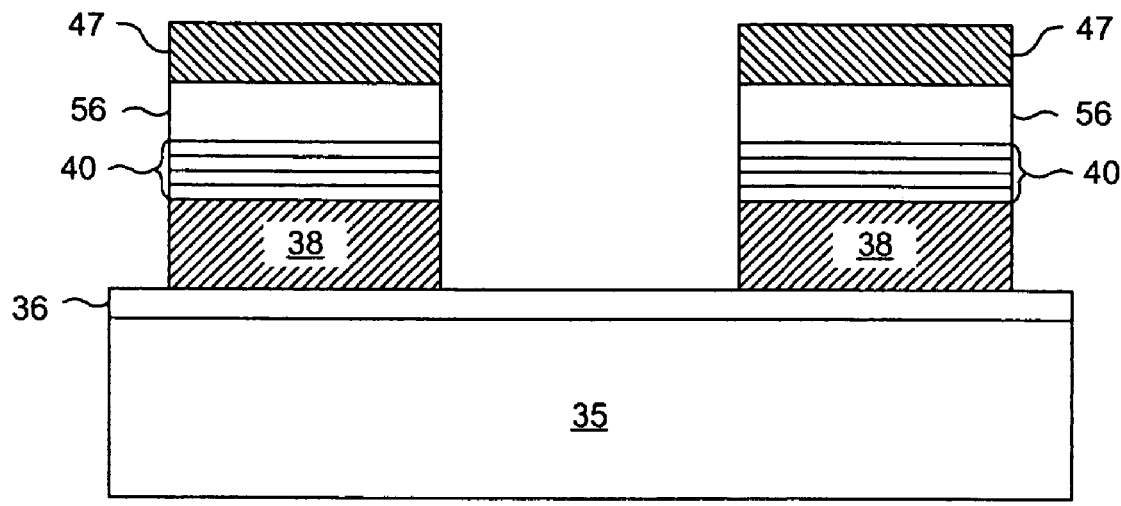
FIG. 3 is a cross-sectional view of the configuration illustrated in FIG. 2 in which the film stack has been mask etched down to the ILD layer in accordance with the present invention.

FIG. 3 illustrates the resulting structure after exposed parts of the material layer 56, the multi-layered anti-reflective coating 40, and the metal layer 38 have been etched down to the ILD layer 36. The resulting structure thus includes metallic lines formed by the metal layer 38 remaining within first boundaries over portions of the substrate 35 covered by photoresist 47. The structure further includes portions not covered by photoresist 47 within second boundaries on the substrate 35 that have been etched.

Figure 4:
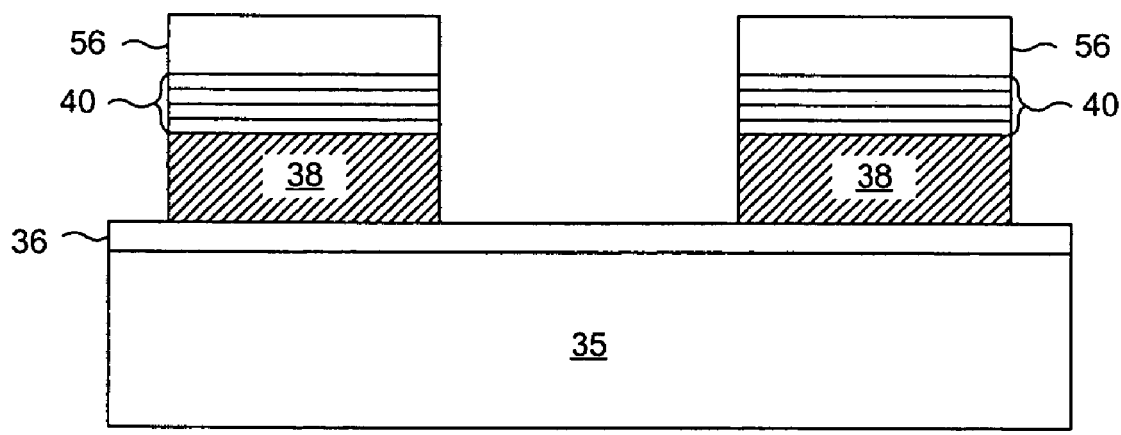
FIG. 4 is a cross-sectional view of the configuration of FIG. 3 in which the photoresist layer has been removed in accordance with the present invention.

In a subsequent processing step, the wafer is placed into a chemical bath solution, which removes the remaining patterned photoresist mask 47. A cross-sectional view of the wafer after the photoresist has been removed is shown in FIG. 4.

Figure 5:
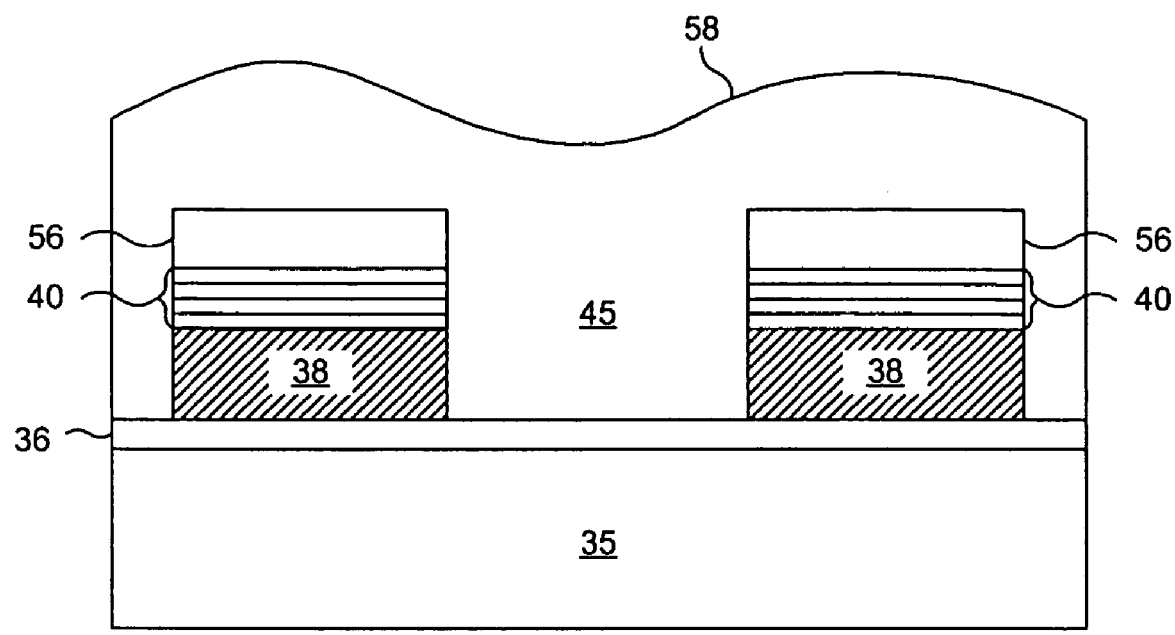
FIG. 5 is a cross-sectional view showing the configuration of FIG. 4 with the addition of a HDP deposited layer according to an embodiment of the present invention.

The following processing step involves the deposition of a dielectric layer onto the substrate 35. As presently embodied, the dielectric layer can comprise silicon dioxide (SiO$_2$) formed by high density plasma chemical vapor deposition (HDP-CVD). FIG. 5 provides a cross-sectional view of the wafer wherein the dielectric layer, henceforth referred to simply as the HDP deposited layer 45, has been formed on the exposed surface topography. The HDP deposited layer 45 fills between the metallic lines and creates a layer of insulation between a current metal layer and any following metal layers.

Since, in the illustrated embodiment, the HDP deposited layer 45 is not deposited on a flat surface; it can inherently have surface contours 58. These contours 58 can create obstacles or steps which render it difficult to spin-on deposit subsequent photoresist 48 (FIG. 6, infra) evenly. Therefore, as presently embodied, the wafer undergoes a process of chemical mechanical polishing (CMP) to create a relatively flat surface. As known to those having skill in the semiconductor processing art, CMP is an abrasive process performed on oxides and metals that is used to polish the surface of the wafer flat. Chemical slurries can be used along with a circular "sanding" action to create a smooth, polished surface. This smooth surface may be necessary, for example, to maintain a proper depth of focus for subsequent steps in the stepper, and can also ensure that the via are not deformed over contour steps.

Figure 6:
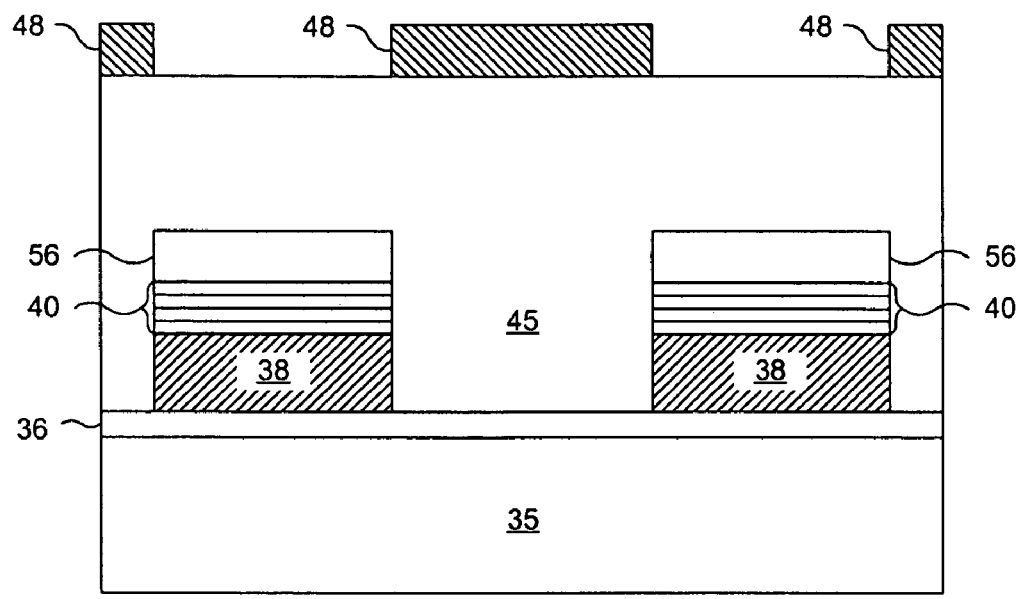
FIG. 6 is a cross-sectional view of the configuration of FIG. 5 in which the HDP deposited layer has been planarized and a patterned photoresist layer has been added according to an embodiment of the present invention.

After the planarization process is performed on the HDP deposited layer 45, another layer of photoresist 48 is spun on, patterned, and exposed to UV radiation to yield the configuration shown in FIG. 6. Exposed portions of the HDP deposited layer 45 and the material layer 56 are then etched using the patterned layer of photoresist 48 as an etch mask, to thereby form via. Each via may contact a region of a corresponding line of multi-layered anti-reflective coating 40.

A via filler 49 is then applied into the etched via, as shown in FIG. 7. Regarding application of via filler 49, the filler may include a conductive material such as tungsten, which is applied by chemical vapor deposition (CVD) into the via. In one embodiment, a glue or barrier metal deposition (not shown) is applied into the etched via before application of the tungsten.

Figure 8A:
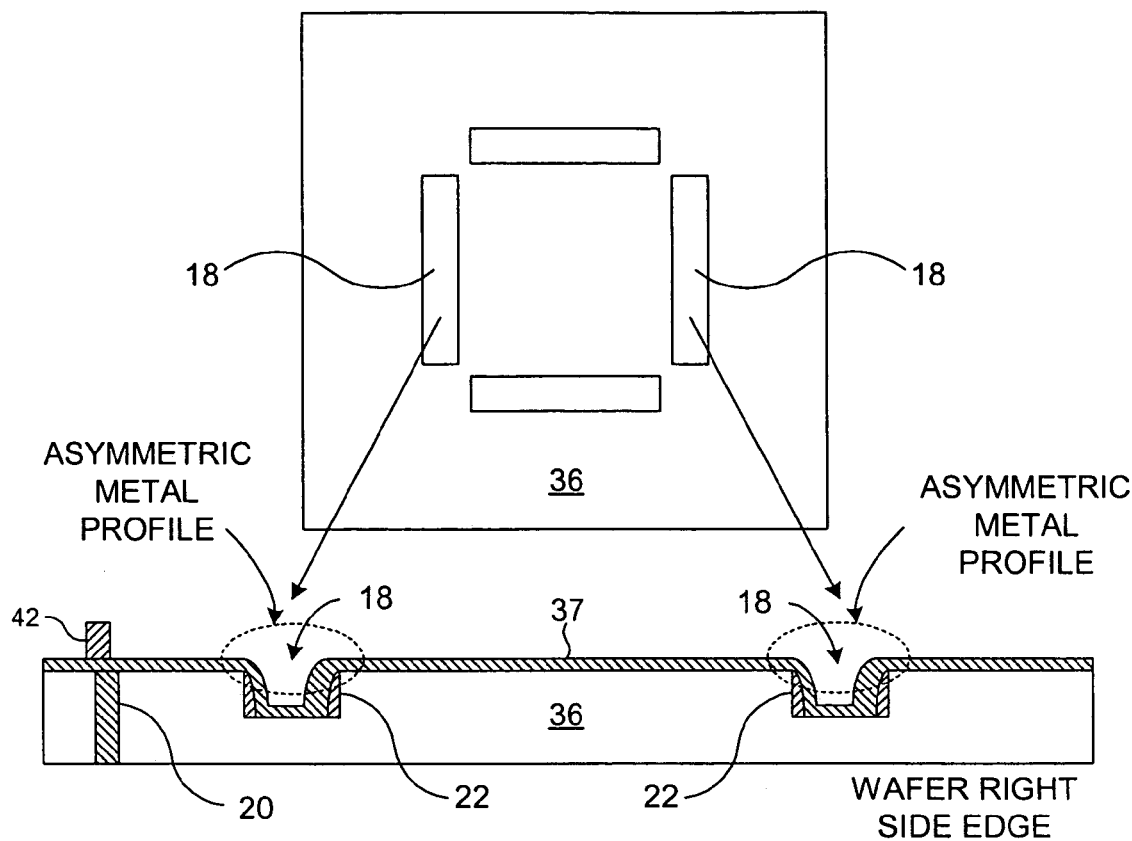
FIG. 8A presents a plan and cross-sectional view of an alignment structure illustrating an asymmetric metal profile.

In accordance with an aspect of the present invention, it has been determined that some methods of forming metal layers may result in less misalignment of, for example, metal lines and contacts, than others. To illustrate, FIG. 8A shows a plan and cross-sectional view of an alignment structure located near a right edge of a wafer. According to the illustrated example, an inter-layer dielectric (ILD) layer 36 is deposited or grown on an underlying layer which may be a substrate formed of silicon. ILDs are used between metal layers, such as an underlying layer and a second layer, to prevent inter-layer shorts. It should be appreciated that many integrated circuits, such as microprocessors and other devices commonly manufactured in the computer industry, can have six or more metal layers separated from one another by ILDs. In certain embodiments, IDL layer 36 may be a thick native silicon-dioxide layer that has been epitaxially grown directly on an amorphous silicon substrate and then planarized. The amorphous silicon substrate may have been doped to create semiconductor devices such as transistors and diodes. In other embodiments, the ILD layer 36 can be any suitable dielectric or other insulator.

At least one alignment mark 18 is formed in the ILD layer 36 in the shape of a trench using well-known photolithography and etching processes. The substrate is then in a condition to be covered with a metal layer 37. In one implementation, however, an optional conductor such as tungsten can be deposited, using sputtering or CVD, and processed before formation of metal layer 37. A planarization step, which may comprise CMP or etching back as presently illustrated, can then be performed to generate optional sidewall features 22, which are depicted in FIG. 8A but not FIGS. 8B and 8C.

A contact 20 is present in the ILD layer 36, and it is desired to create a metal line to overlie and to establish electrical connection with the contact 20. The metal line is formed by depositing metal layer 37 on the ILD layer 36, and forming a pattern of photoresist 42 on the metal layer 37 using a photolithographic process. The metal layer 37 is formed, in the present example, as a layer of aluminum (Al) overlain by a dual layer of Ti/TiN. (Individual Al, Ti, and TiN layers are not shown in FIG. 8A.)

Figure 8B:
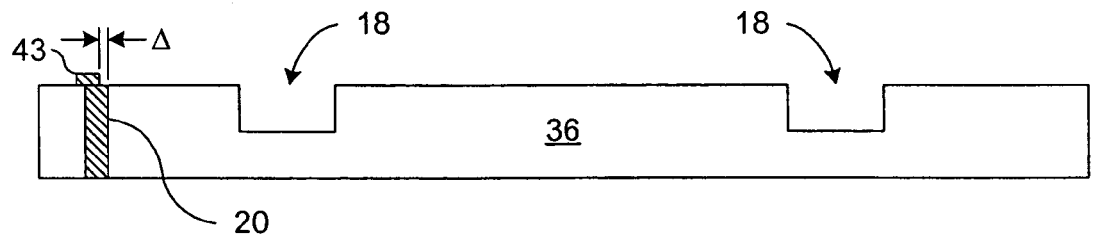
FIG. 8B is a cross-sectional view of the alignment structure of FIG. 8A depicting misalignment between a metal line and a contact.

Thermally induced metal stress can cause an overlay shift in the metal layer 37, thereby creating an asymmetric metal profile relative to the alignment mark 18. The overlay shift in the metal layer 37 causes a shift in the apparent position of the alignment mark 18. Consequently, the pattern of photoresist 42, which is positioned relative to the apparent position of the alignment mark 18, is shifted relative to the location of the contact 20. An etch step then removes portions of the metal layer 37 not masked by the photoresist 42, and the photoresist 42 is removed, creating a metal line 43 as illustrated in FIG. 8B. It can be noted that the shift in the metal layer 37 during the photolithographic process causes a misalignment of Δ between the metal line 43 (extending into the plane of the diagram) and the contact 20.

Figure 8C:
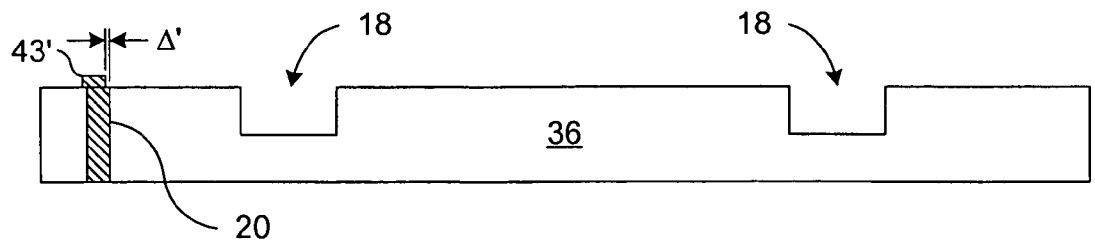
FIG. 8C is a cross-sectional view of the alignment structure of FIG. 8A depicting reduced misalignment between a metal line and a contact in accordance with an aspect of the present invention.

According to an implementation of the present invention, the dual layer of Ti/TiN in the metal layer 37 of FIG. 8A can be replaced with a sandwich-like ARC structure of, for example, Ti/TiN/Ti/TiN as already described. This change in the form of the metal layer 37 can reduce the overlay shift in the metal layer 37, thereby reducing the shift in the apparent position of the alignment mark 18. As a result, the shift in the position of the patterned photoresist 42 can be reduced, resulting in metal line 43', positioned as illustrated in FIG. 8C. The misalignment between the metal line 43' and the contact 20 is reduced to a value Δ', which is significantly less than the value of Δ obtained when a dual layer of Ti/TiN is used in the metal layer 37.

Figure 9A:
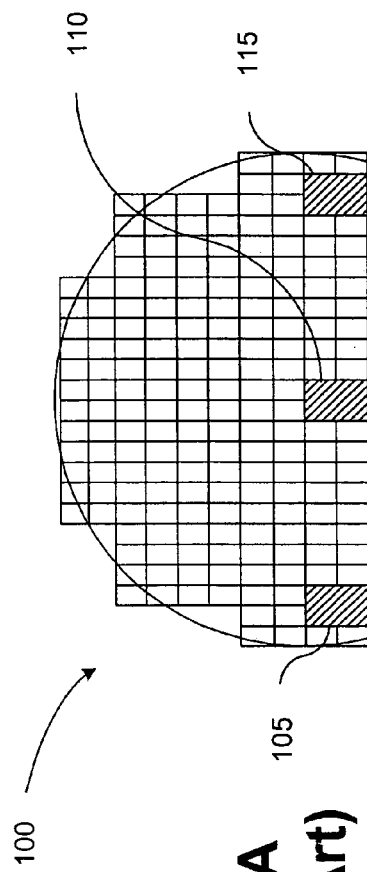
FIGS. 9A-9C show locations of a plurality of alignment structures disposed on a semiconductor wafer and values of profile shifts at those locations in accordance with the prior art.
Figure 9B:
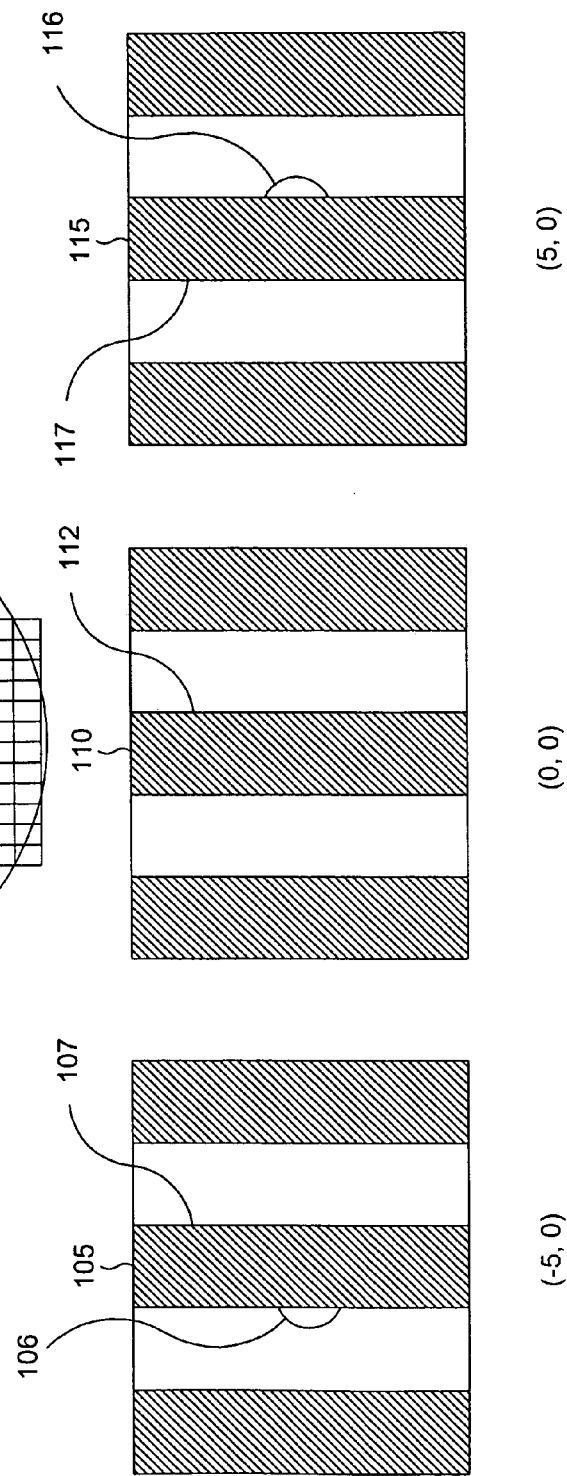

FIG. 9A shows the locations of a plurality of alignment structures disposed on a semiconductor wafer 100. Three representative alignment structures 105, 110, and 115 are singled out for detailed consideration. Each alignment structure may be described by a pair of coordinates that corresponds to a position of the alignment structure relative to the center of the wafer. For example, alignment structure 110 located at the center of the wafer has coordinates (0,0). Alignment structure 105 located five units to the left of the center of the wafer has coordinates (−5, 0). Similarly, alignment structure 115 located five units to the right of the center of the wafer has coordinates (5,0). As illustrated in FIG. 9B, alignment structures 105, 110, and 115 may comprise respective metal lines 107, 112, and 117. According to an illustrative embodiment, the metal lines 107, 112, and 117 in FIG. 9B may correspond to the metal layer 38 (FIG. 4). Each metal line further may have associated with it a contact or via. In an idealized situation, each metal line associated with a contact or via perfectly underlies the contact or via.

However, as already noted, asymmetry in the metal profile can cause relative shifts between a metal line and an associated contact or via. In the illustrated example, contact 106 in alignment structure 105 located at (−5, 0) is misaligned with metal line 107. Similarly, contact 116 in alignment structure 115 located on the opposite side of the wafer at (5, 0) also is misaligned. The effect of misalignment is more pronounced at the edges of the wafer (represented by alignment structures 105 and 115) than at the center of the wafer (represented by alignment structure 110) as illustrated in FIG. 9B.

Figure 9C:
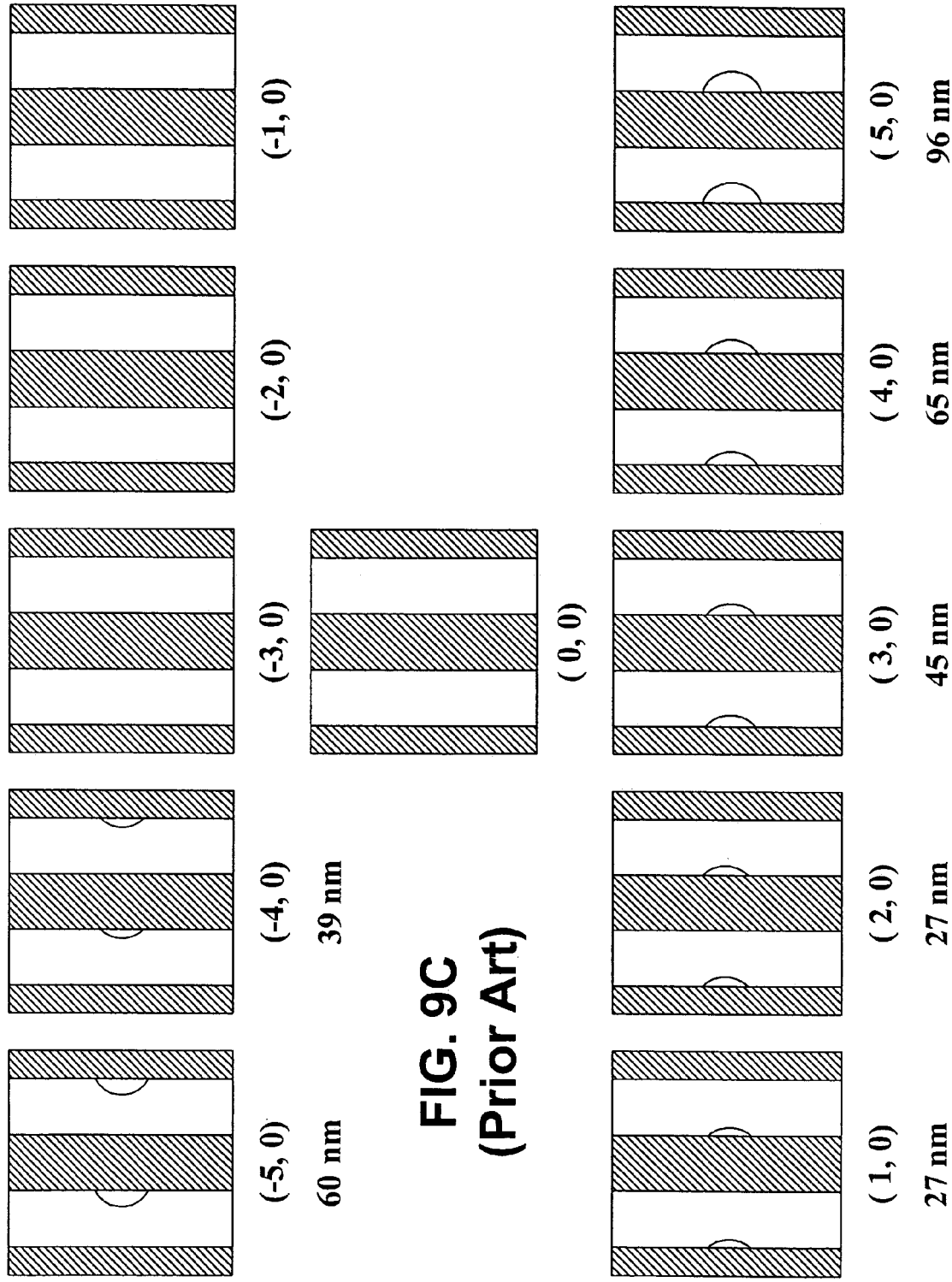

FIGS. 9C-10B illustrate experimental results that demonstrate the utility of the present invention. A plurality of alignment structures disposed on an actual implementation of a semiconductor wafer in accordance with the prior art is illustrated in FIG. 9C. The same coordinate system employed in FIG. 9B is used in FIG. 9C. The individual illustrated alignment structures correspond to alignment structures disposed on a row centered vertically on a wafer similar to the wafer 100 illustrated in FIG. 9A. Values of misalignments of contacts and metal lines are shown on the diagram, the misalignments being measured in nanometers (nm). The misalignment values are nominally zero near the center of the wafer, i.e. at coordinates (−3, 0), (−2, 0), (−1, 0), and (0, 0). However, alignment structures located near the left edge of the wafer, namely those at (−5, 0) and (−4, 0) exhibit misalignments of 60 nm and 39 nm, respectively. Similarly, alignment structures located on the right side of the wafer, i.e. those with coordinates (1, 0), (2, 0), . . . , (5, 0), exhibit respective misalignments of 27 nm, 27 nm, 45 nm, 65 nm, and 96 nm. The average overlay shift represented by the eleven examples shown in FIG. 9C is (60+39+0+0+0+0+27+27+45+65+96)/11 nm, or about 32.6 nm.

Figure 10A:
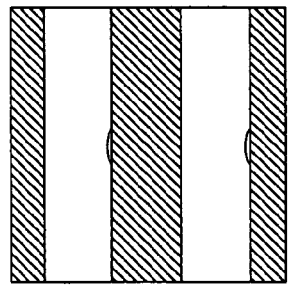
FIGS. 10A-10B show locations of a plurality of alignment structures disposed on semiconductor wafers illustrating lesser values of profile shifts at those locations in accordance with an illustrated embodiment of the present invention.
Figure 10A:
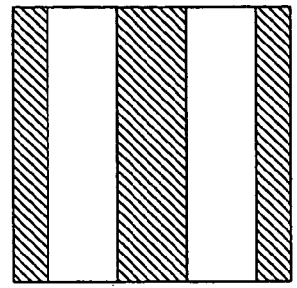
Figure 10A:
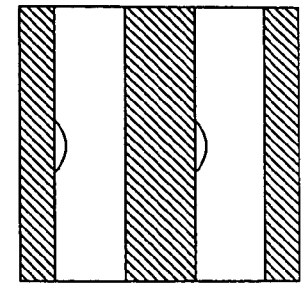
Figure 10B:
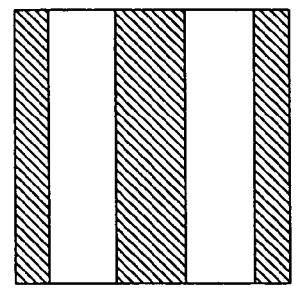
Figure 10B:
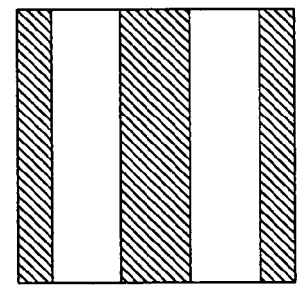
Figure 10B:
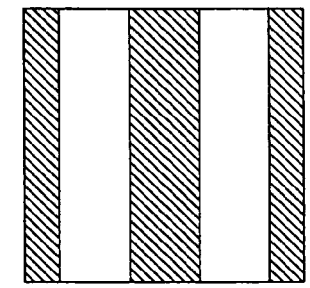

FIG. 9C can be compared to corresponding data shown in FIG. 10A which reflects similar measurements taken from just three points on an actual semiconductor wafer that has been processed in accordance with the present invention. Corresponding misalignments, when aspects of the present invention are applied, are noted to be significantly smaller that those of the prior art. Specifically, the misalignments are measured to be 12 nm at (−5, 0), nominally zero at (0, 0), and 38 nm at (4,0). These reduced misalignment values may not introduce as many visible shifts between metal lines and contacts compared to the prior art misalignments illustrated in FIGS. 9A and 9B. FIG. 10B is similar to FIG. 10A and reflects measurements taken at three points on another actual semiconductor wafer that likewise has been processed according to a method of the present invention. No misalignments are observed in the example illustrated in FIG. 10B. It should be noted that the average overlay shift observed in the six examples shown in FIGS. 10A and 10B is (12+0+38+0+0+0)/6 nm, or about 8.3 nm. This average overlay shift is significantly less than the 32.6 nm average overlay shift observed in the example illustrated in FIG. 9C.

In view of the foregoing, it will be understood by those skilled in the art that the methods of the present invention can facilitate formation of semiconductor devices and, more particularly, to methods for forming planarized multilevel metallization in an integrated circuit. The above-described embodiments have been provided by way of example, and the present invention is not limited to these examples. Multiple variations and modifications to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method, comprising:
 providing a substrate with a conductive layer formed thereon; and
 depositing a multi-layered anti-reflective coating over the conductive layer, wherein the multi-layered anti-reflective coating comprises layers of TiN contacting and alternating with layers of Ti.

2. The method as set forth in claim 1, further comprising forming an inter-layer dielectric (ILD) layer between the substrate and the conductive layer.

3. The method as set forth in claim 1, wherein the multi-layered anti-reflective coating comprises TiN/Ti/TiN/Ti films.

4. The method as set forth in claim 3, further comprising:
 patterning a plurality of conductive lines:
 depositing a dielectric layer; and
 forming at least one via.

5. The method as set forth in claim 4, wherein:
 the forming of at least one via comprises forming a plurality of via;
 the depositing of a dielectric layer comprises depositing a dielectric layer by high density plasma (HDP) chemical vapor deposition (CVD); and
 the plurality of via are filled with a conductive material to form a plurality of contacts.

6. The method as set forth in claim 5, wherein the filling of the via is preceded by depositing barrier metal into the via.

7. A method, comprising:
 providing a substrate with a conductive layer formed thereon; and
 depositing from bottom to top, in order, films of Ti, TiN, Ti, and TiN to form a multi-layered anti-reflective coating over the conductive layer.

8. The method as set forth in claim 1, wherein the depositing of a multi-layered anti-reflective coating is followed by depositing a material layer.

9. The method as set forth in claim 8, wherein the depositing of a material layer comprises depositing silicon oxynitride (SiON).

10. A structure formed using the method of claim 1.

11. A structure formed using the method of claim 6.

12. A method, comprising:
 providing a substrate with a conductive layer formed thereon;
 depositing a multi-layered anti-reflective coating formed of multiple Ti and multiple TiN layers all contacting one another and being formed over the conductive layer;
 defining a plurality of conductive lines in association with a first etching step;
 depositing a dielectric layer; and
 defining at least one via in association with a second etching step.

13. The method of claim 12, further comprising providing an inter-layer-dielectric (ILD) layer disposed between the substrate and the conductive layer.

14. A method, comprising:
 providing a substrate with a conductive layer formed thereon;
 depositing, form top to bottom, TiN/Ti/TiN/Ti films to form a multi-layered anti-reflective coating over the conductive layer;
 defining a plurality of conductive lines in association with a first etching step;
 depositing a dielectric layer; and
 defining at least one via in association with a second etching step.

15. The method as set forth in claim 12, wherein: the depositing of a dielectric layer comprises depositing a dielectric layer by high density plasma (HDP) chemical vapor deposition (CVD); and the defining of at least one via comprises defining a plurality of via.

16. The method as set forth in claim 15, wherein the depositing of a multi-layered anti-reflective coating is followed by filling the plurality of via with a conductive material to form a plurality of contact.

17. A structure formed using the method of claim 12.

18. A structure formed using the method of claim 16.

* * * * *